(12) United States Patent
Yang et al.

(10) Patent No.: US 6,251,565 B1
(45) Date of Patent: Jun. 26, 2001

(54) METHOD OF MAKING MOLDS FOR MANUFACTURING MULTIPLE-LEAD MICROSTRUCTURES

(75) Inventors: Hsi-Harng Yang, ChangHua Hsien; Min-Chieh Chou, Taipei; Cheng-Tang Pan, TaiNan; Chuan-Kang Mu, TaiChung, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/376,665

(22) Filed: Aug. 16, 1999

(51) Int. Cl.[7] .................. C25D 1/10; G03F 7/00
(52) U.S. Cl. .................. 430/320; 430/967; 205/70
(58) Field of Search .................. 430/320, 966, 430/967; 205/70

(56) References Cited

U.S. PATENT DOCUMENTS

| | | | |
|---|---|---|---|
| 5,645,977 | * | 7/1997 | Wu et al. .................. 430/320 |
| 6,093,520 | * | 7/2000 | Vladimirsky et al. ............... 430/326 |

\* cited by examiner

Primary Examiner—John A. McPherson
(74) Attorney, Agent, or Firm—W. Wayne Liauh

(57) ABSTRACT

A method of making molds for use in manufacturing high precision and high density multiple-lead microstructures. If employs microphoto etching process used in semiconductor manufacturing process to project X-ray and ultraviolet light on a photoresist layer through a X-ray co-mask and a generally used mask to produce exposing process. Through etching and electroplating processes, a plurality of identical punch molds may be made. The punch molds are aligned stacked up one upon the other until a desired height is reached. The stacked up punch molds are electroplated to form a lead punch die for producing microparts desired.

6 Claims, 10 Drawing Sheets

METHOD OF MAKING MOLDS FOR MANUFACTURING MULTIPLE-LEAD MICROSTRUCTURES

BACKGROUND OF THE INVENTION

1. Field of the Invention

The present invention discloses another method that employs micro photo etching technique used in semiconductor manufacturing to fabricate a plurality of molds then stacking up and electroplating the molds to form a multiple-lead punch die for producing microparts.

2. Description of the Prior Art

Traditional ways of manufacturing microparts generally include optical projective wheel grinding and wire cutting EDM (Electro-Discharged Machining). These methods use mechanical machining to make the parts to the required dimension. As mechanical machining has its inherent precision limitation, it usually is difficult or impossible to produce the microparts in large quantity while still maintain high degree of dimensional precision.

Another traditional way to produce microparts in large quantity is through punching process that uses molds such as punches, strippers and die plate. However the molds usually have to be made by mechanical machining which has precision problem set forth above. Moreover the machining stress and residual stress becomes another factor making precise dimension difficult to attain.

Nevertheless using punch molds for producing microparts is still a widely used method. This method includes to fabricate single or simple parts by mechanical machining, then assemble the parts to become molds such as punches, strippers and die plates. However this method introduces other type of problems. One is that it needs multiple working stations to perform all the machining required. Production time and cost become higher. Another problem is that the pitch between leads is large due to mechanical factors. It therefore becomes very difficult to produce large number of leads within a small dimension. All this becomes serious issue to be resolved when trying to mass produce microparts with high precision at low cost.

FIGS. 1 and 2 illustrate an example of the traditional ways set forth above. A press board 1 consists of four different mold plates (FIG. 1A). Each mold plate has one or more guided hole 10 which is formed by wire cutting EDM (FIG. 1B). The mold plate may also consist of an upper mold plate 12 and a lower mold plate 14 which are made respectively by optical projective wheel grinding and then be assembled together (FIG. 1C).

FIG. 2 illustrates a mold assembly made by the pressboard shown in FIG. 1. There is a fixed board 20 which has a plurality of screw holes 28 and grooves 29 formed therein. A punch 15 for a guided hole 16 is mounted on a groove. Each punch 15 has a slant section 18 adjacent the guide hole 16 and a key way 24 adjacent the groove 29. A metal key 22 engages with the keyways of the assembled punches and being fastened tightly to the fixed board 20 by means of screws 26 engaging with screw holes 28.

FIG. 3 illustrates the method of using LIGA technique to make molds for producing multiple-lead microstructures disclosed by Applicant in U.S. Pat. No. 5,645,977. It includes disposing a layer of resist 30 on a base plate 33. Then a mask 31 is placed above the resist 30. A X-ray (or ultraviolet light) 32 is employed to project upon the mask 31 to form a lead punch 34 in the resist layer 30 (FIGS. 3A and 3B). Then an electroplating process is performed on the lead punch 34 to form an electroforming metal layer 35 thereon (FIG. 3C). Finally, the base plate 33 and the lead punch 34 are removed to obtain the electroforming metal layer 35 with lead dies 351 formed therein.

SUMMARY OF THE INVENTION

The object of this invention is to further extend the aforesaid method by including microetching technique used in semiconductor manufacturing process and a co-pattern mask to form punch molds for producing high density and high precision multiple-lead microstructures.

In one embodiment of this invention, a conductive layer is firstly formed on a lower photoresist layer and an upper photo resist layer is then formed on the conductive layer. Then a mask is placed above the upper photo resist layer. The mask and the photo resist layer are then exposed to an ultraviolet light to produce reaction in the upper photo resist layer. After etching process, the upper photo resist layer forms the mold releases required. The mold recesses are then processed by electroplating to form a metal mold. The upper photo resist layer and the conductive layer are then removed. The remaining structure is subjected to a X-ray exposure and another etching process. Then the base plate and the co-pattern mask are removed to get the punch mold required. The aforesaid process is repeated a number of times to obtain multiple number of punch molds. Then stacking and overlaying the punch molds one upon another until a desired height is reached. The stacked up punch mold then is processed by another round of electroplating to become a finished punch mold.

Through the X-ray co-pattern mask, a punch mold for multiple-lead microstructures may be made for producing the multiple-lead microstructures. The thickness of the punch mold may be made more than the depth of X-ray engraving. The lead number density may be increased and flexibly deployed. Through electroplating process, the punch mold surface may be covered by a layer of material of high hardness. It greatly enhances wear resistance and durability. It thus may be used for mass production of microparts at a low cost.

BRIEF DESCRIPTION OF THE DRAWINGS

The invention, as well as its many advantages, may be further understood by the following detailed description and drawings in which.

DETAILED DESCRIPTION OF THE PREFERRED EMBODIMENT

This invention mainly employs semiconductor manufacturing techniques such as chip oxidization, diffusion, deposition, deploying of photo resist and mask, and micro photo etching process that can produce minimum line width down to 0.25 $\mu$m for fabricating high density and precision microparts.

Figure 1:
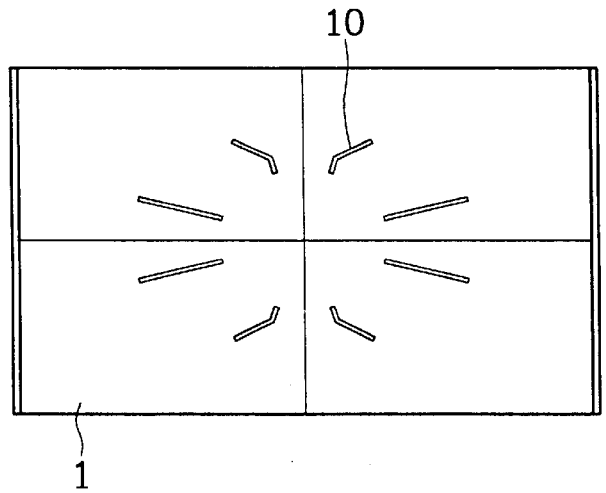
FIG. 1 is the schematic top view of a pressboard for a traditional punch die.
Figure 1:
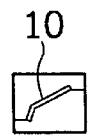
Figure 1:
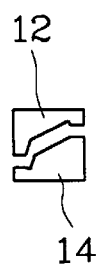
Figure 2:
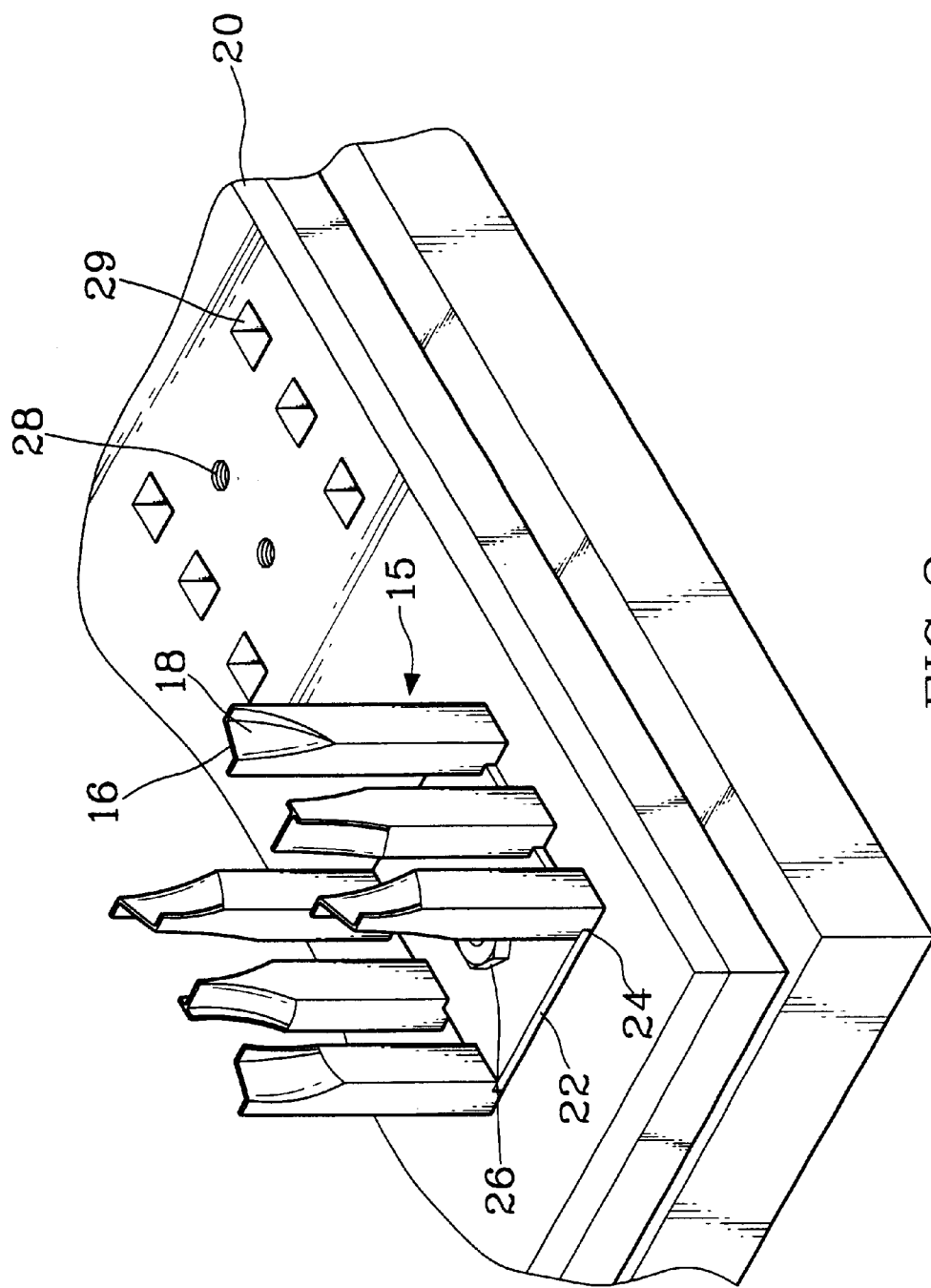
FIG. 2 is a perspective view of a traditional punch mold assembly.
Figure 3:
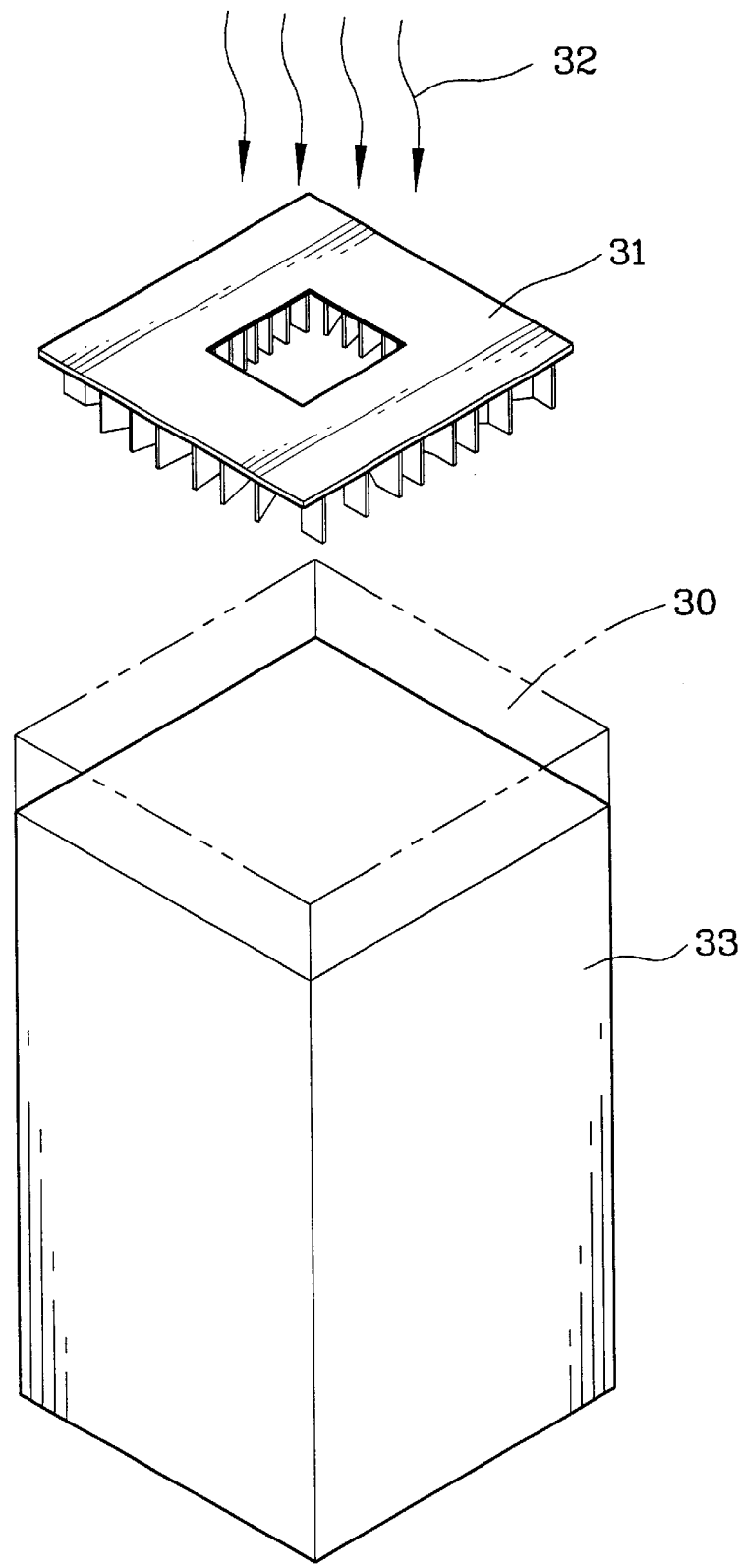
FIG. 3 is the schematic isometric drawing of using LIGA technique for making molds as disclosed by applicant in U.S. Pat. No. 5,645,977.
Figure 3:
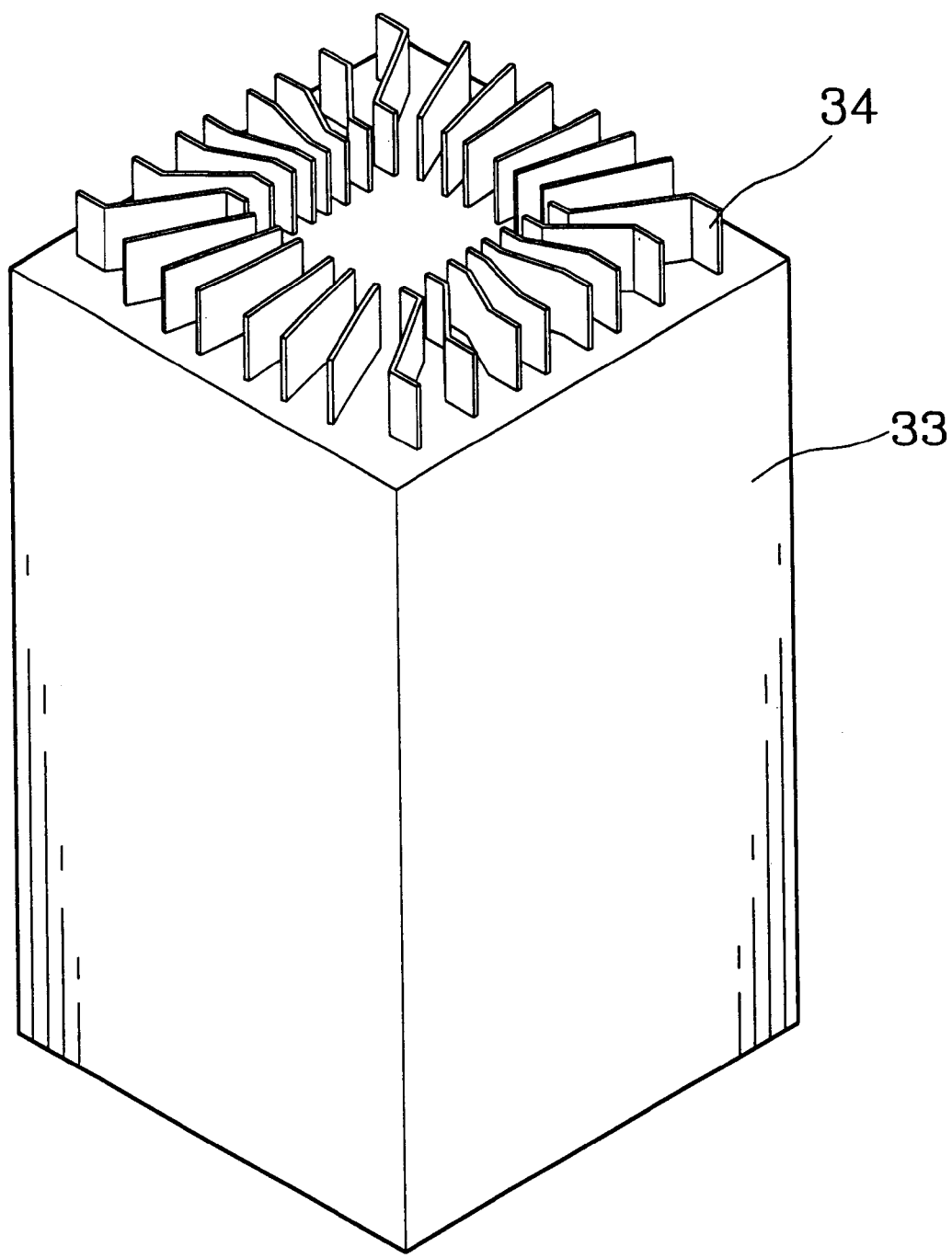
Figure 3:
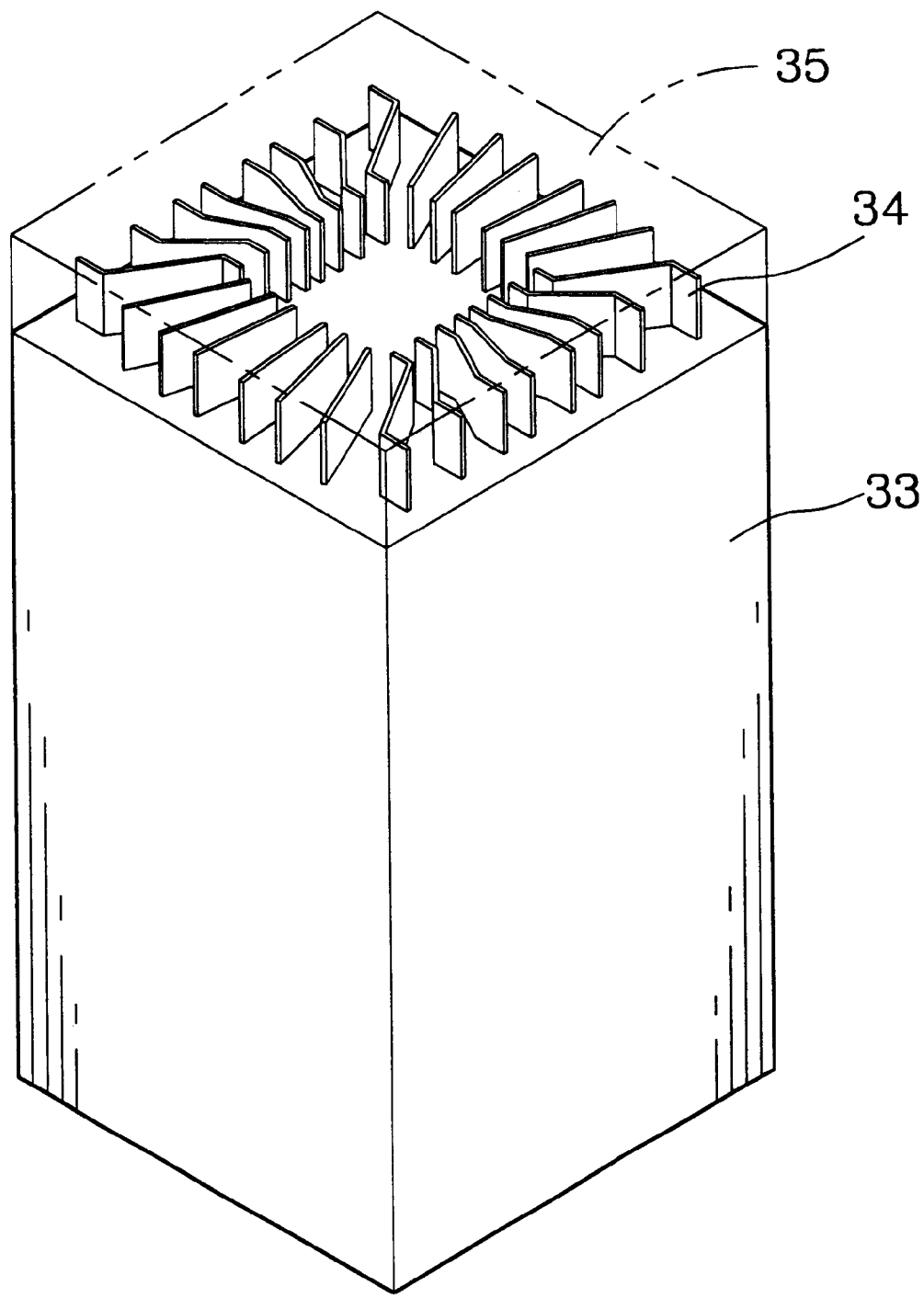
Figure 3:
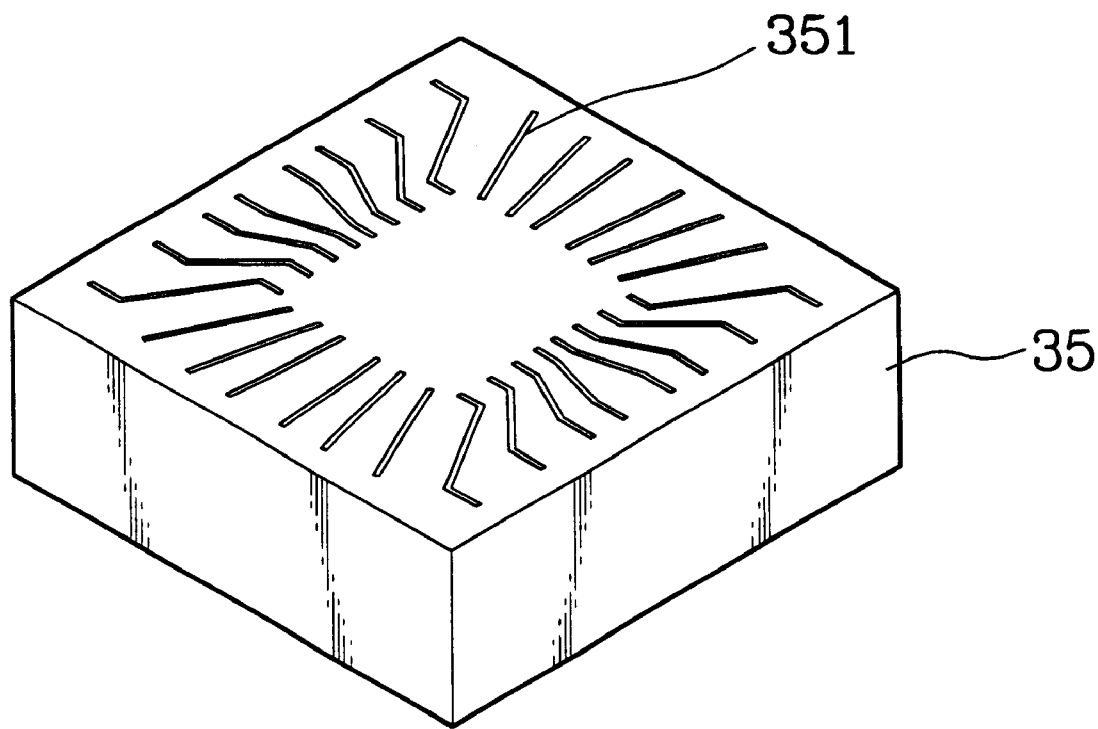
Figure 4:
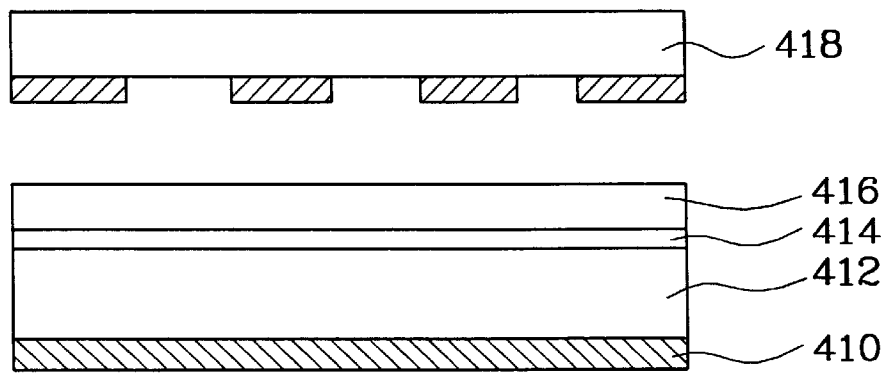
FIG. 4 is the schematic diagram of the process steps of this invention.
Figure 4:
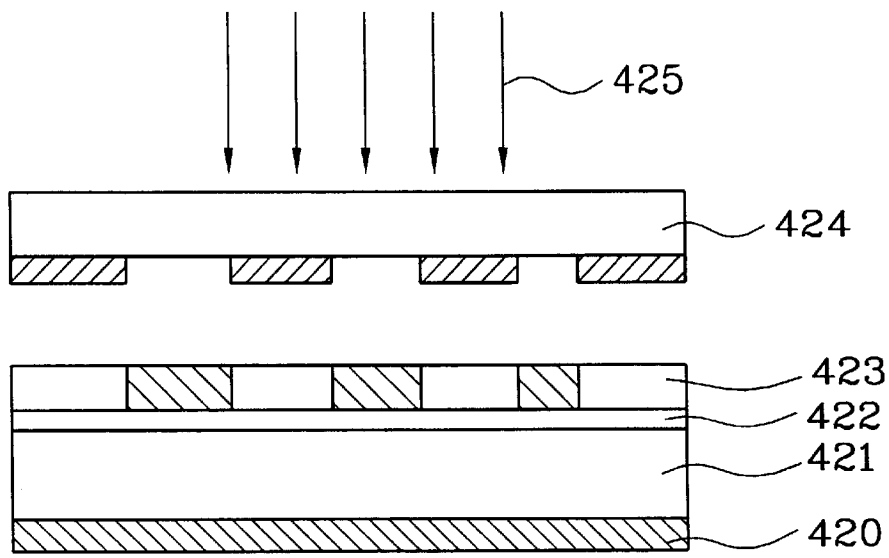
Figure 4:
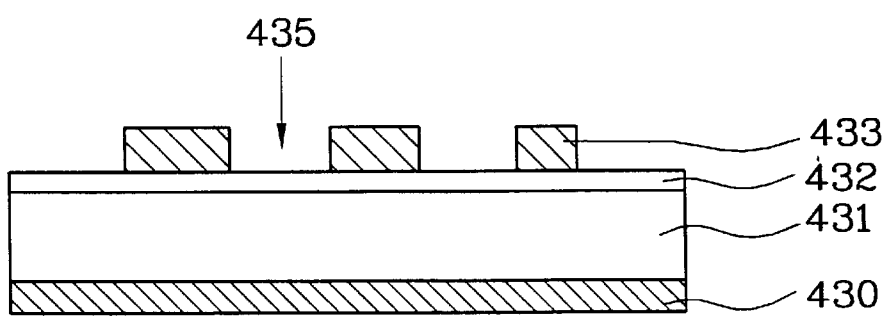
Figure 4:
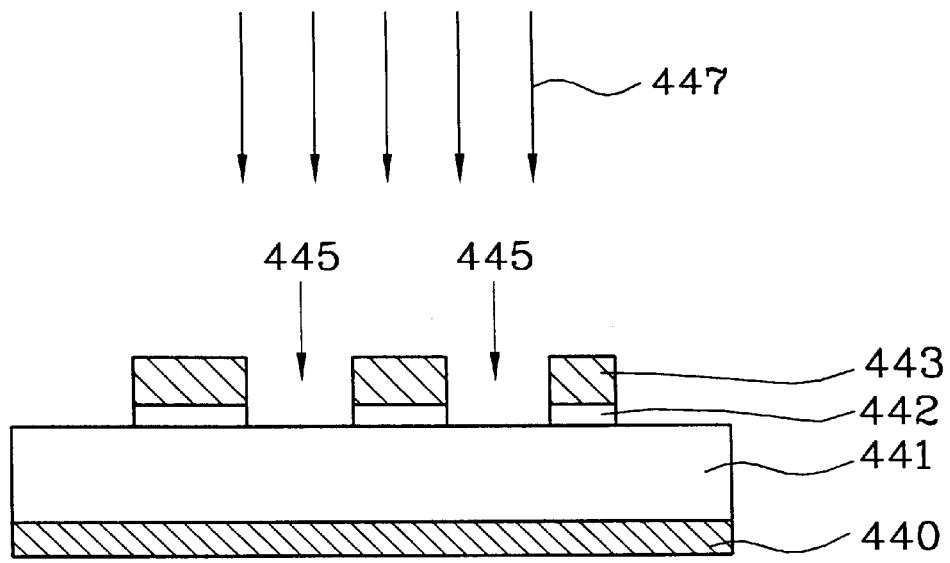
Figure 4:
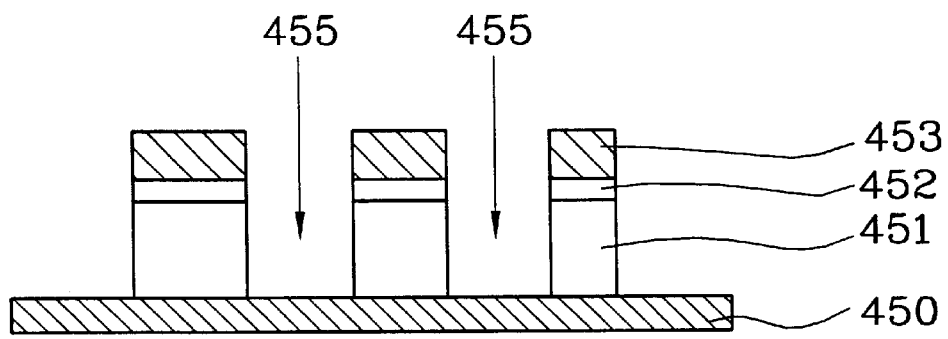
Figure 4:
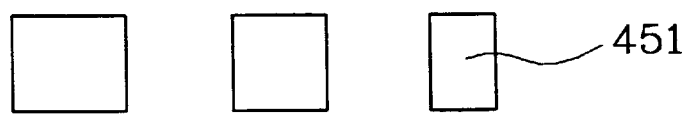
Figure 4:
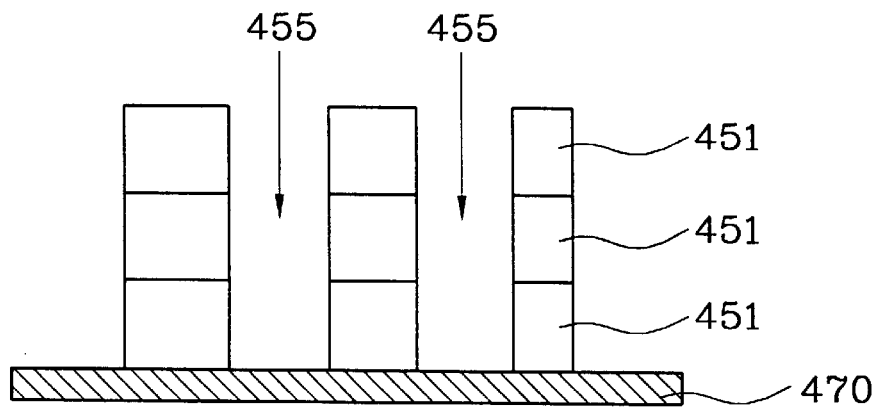
Figure 4:
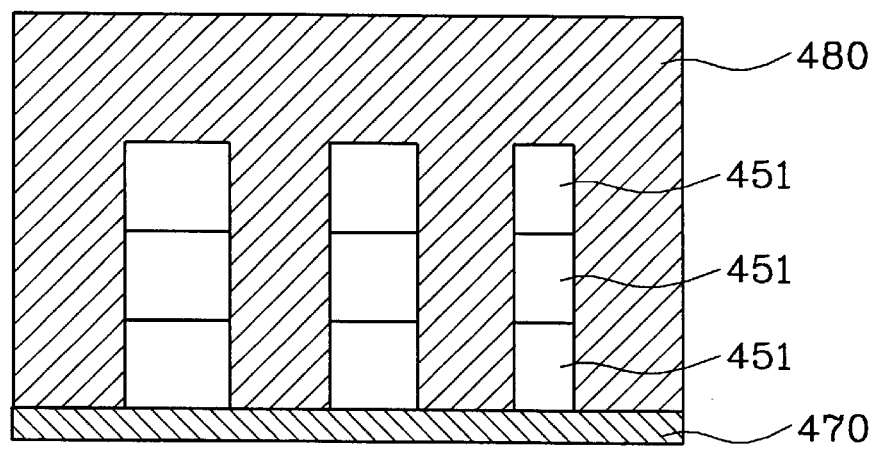
Figure 4:
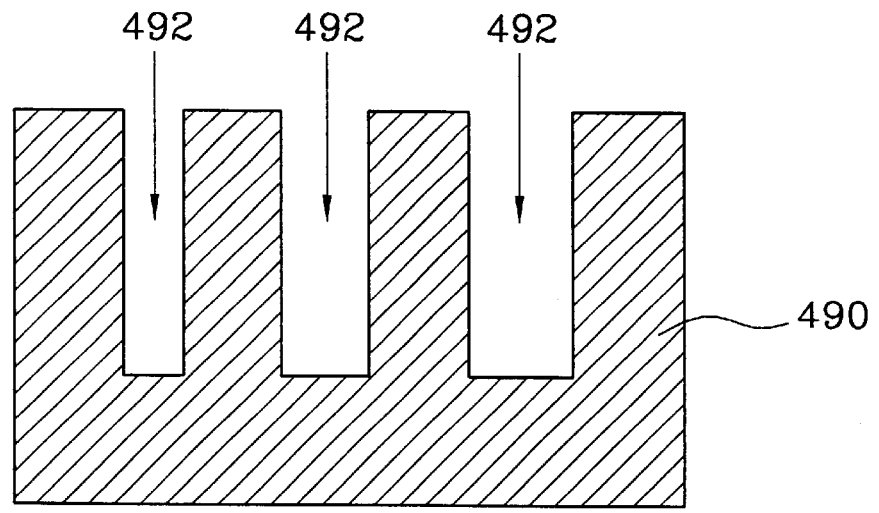

FIG. 4 illustrates the process steps of this invention. FIG. 4A depicts the first step in which a lower photo resist layer 412 made from a polymer material such as acrylic is laid upon a base plate 410. Above the lower photoresist layer 412, a thin conductive layer 414 is disposed thereon, usually by sputtering copper. Then an upper photoresist layer 416 is laid upon the conductive layer 414. Afterward, an ultraviolet light mask 418 is disposed above the upper photoresist layer 416. The mask 418 is made of a glass substrate laid with a layer of chrome made pattern.

The photo resist layers 416 and 412 are flat and lucid. The conductive layer 414 and the base plate 410 are flatly formed. In the second step (FIG. 4B), the mask 424 and the upper photo resist layer 423 are exposed to ultraviolet light 425. The upper photo resist layer 423 contains ultraviolet light sensitive elements and will incur photo developing reaction to form a pattern same as the mask 424. This is generally called exposition process. The pattern in the mask 424 is made by computer program which can achieve high degree of precision for making punches for microparts. The upper photo resist layer 423 is gone through an etching process and then being electroplated to form a metallic film such as a gold film to couple with the conductive layer 422. The remaining photo resist layer is then removed to form a member shown in FIG. 4C. It includes a base plate 430, a lower photo resist layer 431, a conductive layer 432 which is also served as an electrode in the electroplating process and an electroforming pattern 433.

In the fourth step, the portion of the conductive layer 432 that has not been covered by the electroforming pattern 433 is removed by another etching process which has been controlled to avoid reaction with the lower photo resist layer 431. Then a resulting member may be obtained as shown in FIG. 4D. It includes a base plate 440, a lower photo resist layer 441 which is sensitive to and may have reaction with X-ray, a patterned conductive layer 442 and an electroforming pattern 443.

In the fifth step, the member shown in FIG. 4D is subject to X-ray exposing. The uncovered portion of the lower photo resist 442 has reaction with the X-ray. After etching process, the reaction portion of the lower photo resist layer 442 is removed to form a member shown in FIG. 4E. It includes a base plate 450, a lower photo resist layer 451, a conductive layer 452, an electroforming pattern 453 and deep engraving troughs 455.

In the sixth step, the member obtained in FIG. 4E is gone through another etching process. The base plate 450, conductive layer 452 and the electroforming pattern 453 will be removed through physical or chemical means. Only the lower photoresist layer 451 which has patterns formed therein remains. The resulting member is shown in FIG. 4F.

In the seventh step, a plurality of lower photo resist layers 451 obtained in the sixth step are stacked up one upon the other on a punch board 470 until reaching a thickness desired (as shown in FIG. 4G).

In the eighth step, an electroplating process is applied to the stacked members shown in FIG. 4G to obtain an electroforming member 480 as shown in FIG. 4H. Appropriate electroplating agent should be selected to obtain the electroforming property desired. The punch board 470 may serve as an electrode in the electroplating process.

The final step is to remove the stacked up lower photo resist layer 451 and the punch board 470 to obtain a punch mold 490 as shown in FIG. 4I. It has patterned trough 492 as desired.

In the processes set forth above, X-ray and ultraviolet light have been used. It is to be noted that other high level or high precision energy beams such as E-beam and ionized beam may also be used once they are developed to an acceptable level.

In summary, this invention disclosed method which uses high energy beam to form punch molds for producing high precision microparts. It includes a base plate which has no-reaction with the energy beam being used, a light sensitive upper photo resist layer, a conductive layer, a light sensitive lower photo resist layer and an ultraviolet light mask. The ultraviolet light mask is made of a thin glass with desired patterns laid thereon.

The upper photo resist layer, the conductive layer and the lower photo resist layer are stacked on the base plate and are exposed to ultraviolet light through the ultraviolet light mask to form the patterned thereon. Through developing and etching process, a punch mold recess will be formed on the upper photo resist layer. By means of electroplating and another etching process, the undesired portion of the conductive layer will be removed.

Through another X-ray exposing and etching processing, the patterns desired will be formed on the lower photoresist layer while the upper photo resist layer and the conductive layer are removed. The patterned lower photo resist layer is then stacked up one upon the other to the height desired.

The stacked up lower photo resist layer is then gone through an electroplating process to become an electroforming punch mold required.

Figure 5:
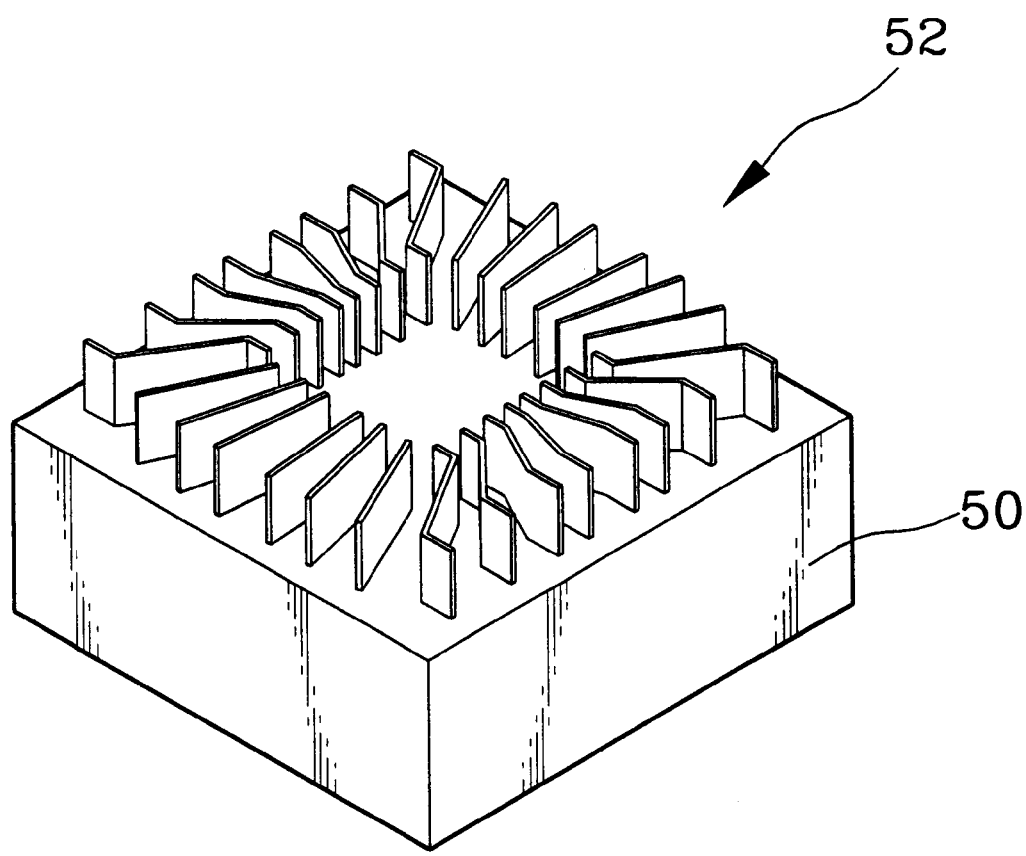
FIG. 5 is a perspective view of a finished punch mold according to this invention.

FIG. 5 illustrates an embodiment made by this method. On the punch mold base 50, a plurality of lead punch dies 52 are formed. It can be used for producing high precision and high density microparts in large quantity at low costs.

It may thus be seen that the objects of the present invention set forth herein, as well as those made apparent from the foregoing description, are efficiently attained. While the preferred embodiments of the invention have been set forth for purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method for making molds for use in manufacturing multiple-lead micro structures, comprising the steps of:
   (a) forming a lower photoresist layer which is sensitive to X-ray on a base plate;
   (b) forming a conductive layer on the lower photoresist layer;
   (c) forming an upper photoresist layer which is sensitive to ultraviolet light on the conductive layer;
   (d) exposing the upper photoresist layer to ultraviolet light under a light mask, then etching the upper photoresist layer to form a upper photoresist pattern similar to the light mask;
   (e) using the upper photoresist pattern as a mask, etching the conductive layer to form a conductive layer pattern also similar to the light mask;
   (f) exposing the lower photoresist layer to X-ray light using the conductive layer pattern as a mask, then etching the lower photoresist layer to remove the exposed portion of the lower photoresist layer to form a lower photoresist member;
   (g) repeating steps (a) through (f), then stacking a plurality of the lower photoresist members so formed one upon another on a punch board so that the aggregate of the stacked lower photoresist members reaches a height;

(h) electroplating the stacked lower photoresist members to form an electroforming member; and (i) removing the punch board and the stacked lower photoresist members to form a punch mold.

2. The method for making molds for use in manufacturing multiple-lead micro structures according to claim 1, wherein the light mask is made of a glass substrate laid with a layer of chrome made pattern.

3. The method for making molds for use in manufacturing multiple-lead micro structures according to claim 1, wherein the conductive layer is formed by sputtering copper on the lower photoresist layer.

4. The method for making molds for use in manufacturing multiple-lead micro structures according to claim 1, wherein the lower photoresist layer is formed of an acrylic polymer.

5. The method for making molds for use in manufacturing multiple-lead micro structures according to claim 1, which further comprises the step of electroplating a metallic film to cover the upper photoresist pattern and the conductive layer after the upper photoresist pattern is formed.

6. The method for making molds for use in manufacturing multiple-lead micro structures according to claim 5, wherein the metallic film is a gold film.

* * * * *